(12) United States Patent
Kinsley (10) Patent No.: US 10,748,872 B2
(45) Date of Patent: Aug. 18, 2020

(54) INTEGRATED SEMICONDUCTOR ASSEMBLIES AND METHODS OF MANUFACTURING THE SAME

(71) Applicant: Micron Technology, Inc., Boise, ID (US)

(72) Inventor: Thomas H. Kinsley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/683,609

(22) Filed: Aug. 22, 2017

(65) Prior Publication Data
US 2019/0067245 A1    Feb. 28, 2019

(51) Int. Cl.
*H01L 25/065* (2006.01)
*H01L 23/00* (2006.01)
(Continued)

(52) U.S. Cl.
CPC .......... *H01L 25/0657* (2013.01); *H01L 23/13* (2013.01); *H01L 23/315* (2013.01); *H01L 23/481* (2013.01); *H01L 23/49503* (2013.01); *H01L 23/49822* (2013.01); *H01L 24/07* (2013.01); *H01L 24/17* (2013.01); *H01L 25/50* (2013.01); *H01L 21/563* (2013.01); *H01L 24/13* (2013.01); *H01L 24/16* (2013.01); *H01L 24/48* (2013.01); *H01L 2224/13101* (2013.01); *H01L 2224/1403* (2013.01); *H01L 2224/14181* (2013.01); *H01L 2224/16145* (2013.01); *H01L 2224/16225* (2013.01); *H01L 2224/48145* (2013.01); *H01L 2225/06513* (2013.01);
(Continued)

(58) Field of Classification Search
CPC ....... H01L 2924/00014; H01L 2924/00; H01L 2224/48247; H01L 2224/73265; H01L 2924/01047
See application file for complete search history.

(56) References Cited

U.S. PATENT DOCUMENTS 7,098,542 B1 * 8/2006 Hoang .................... H01L 23/13
                                                       257/778
8,278,141 B2 * 10/2012 Chow .................... H01L 21/563
                                                       438/106
(Continued)

OTHER PUBLICATIONS

International Application No. PCT/US2018/046793—International Search Report and Written Opinion, dated Dec. 14, 2018, 15 pages.
(Continued)

*Primary Examiner* — Tony Tran
(74) *Attorney, Agent, or Firm* — Perkins Coie LLP (57) ABSTRACT

Integrated semiconductor assemblies and associated methods of manufacturing are disclosed herein. In one embodiment, a semiconductor device assembly comprises a base substrate having a cavity and a perimeter region at least partially surrounding the cavity. The cavity is defined by sidewalls extending at least partially through the substrate. The assembly further comprises a first die attached to the base substrate at the cavity, and a second die over at least a portion of the first die and attached to the base substrate at the perimeter region. In some embodiments, the first and second dies can be electrically coupled to each other via circuitry of the substrate.

21 Claims, 11 Drawing Sheets

(51) Int. Cl.
  *H01L 23/31* (2006.01)
  *H01L 23/495* (2006.01)
  *H01L 23/48* (2006.01)
  *H01L 25/00* (2006.01)
  *H01L 23/13* (2006.01)
  *H01L 23/498* (2006.01)
  *H01L 21/56* (2006.01)

(52) U.S. Cl.
  CPC ............... *H01L 2225/06517* (2013.01); *H01L 2225/06562* (2013.01); *H01L 2225/06568* (2013.01); *H01L 2924/00014* (2013.01); *H01L 2924/14* (2013.01); *H01L 2924/15153* (2013.01); *H01L 2924/15311* (2013.01); *H01L 2924/18161* (2013.01)

(56) References Cited

U.S. PATENT DOCUMENTS

| | | | |
|---|---|---|---|
| 2007/0069371 | A1 | 3/2007 | Iksan et al. |
| 2011/0317381 | A1 | 12/2011 | Kim et al. |
| 2013/0277865 | A1 | 10/2013 | Teh et al. |
| 2016/0276309 | A1* | 9/2016 | Paek .................. H01L 25/50 |
| 2017/0047308 | A1 | 2/2017 | Ho et al. |
| 2018/0204821 | A1* | 7/2018 | Guo .................. H01L 23/13 |

OTHER PUBLICATIONS

Office Action dated Jul. 31, 2019 for Taiwan Patent Application No. 107128696, 5 pages.
Office Action dated Nov. 12, 2019 for Taiwan Patent Application No. 107128696, 15 pages (with translation).

* cited by examiner

INTEGRATED SEMICONDUCTOR ASSEMBLIES AND METHODS OF MANUFACTURING THE SAME

CROSS-REFERENCE TO RELATED APPLICATION(S)

The present technology is directed to packaging semiconductor devices, such as memory and processors, and several embodiments are directed to integrated semiconductor assemblies including substrates having cavities.

BACKGROUND

Packaged semiconductor dies, including memory dies, microprocessor dies, and interface dies, typically include a semiconductor die mounted on a substrate and encased in a plastic protective covering. The die includes functional features, such as memory cells, processor circuits, and interconnecting circuitry, as well as bond pads electrically connected to the functional features. The bond pads are often electrically connected to external terminals that extend outside of the protective covering to allow the die to be connected to busses, circuits or other higher level circuitry.

Semiconductor die manufacturers are under increasing pressure to continually reduce the size of die packages to fit within the space constraints of electronic devices, while also increasing the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. Stacking multiple dies, however, increases the vertical profile of the device, requiring the individual dies to be thinned substantially to achieve a vertically compact size. Additionally, the stacking of multiple dies can increase the probability of device failure, and lead to higher costs associated with longer manufacturing and testing times.

DETAILED DESCRIPTION

Specific details of several embodiments of stacked semiconductor die packages and methods of manufacturing such die packages are described below. The term "semiconductor device" generally refers to a solid-state device that includes semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "stacked package assembly" can refer to an assembly of one or more individual semiconductor device packages stacked on each other or a package-on-package assembly.

As used herein, the terms "vertical," "lateral," "top," "bottom," "upper," and "lower" can refer to relative directions or positions of features in the semiconductor device or package in view of the orientation shown in the Figures. For example, "upper" or "outermost" can refer to a feature positioned closer to the top of a page than another feature. These terms, however, should be construed broadly to include semiconductor devices having other orientations, such as inverted or inclined orientations where top/bottom, over/under, above/below, up/down, vertical/horizontal and left/right can be interchanged depending on the orientation.

Figure 1A:
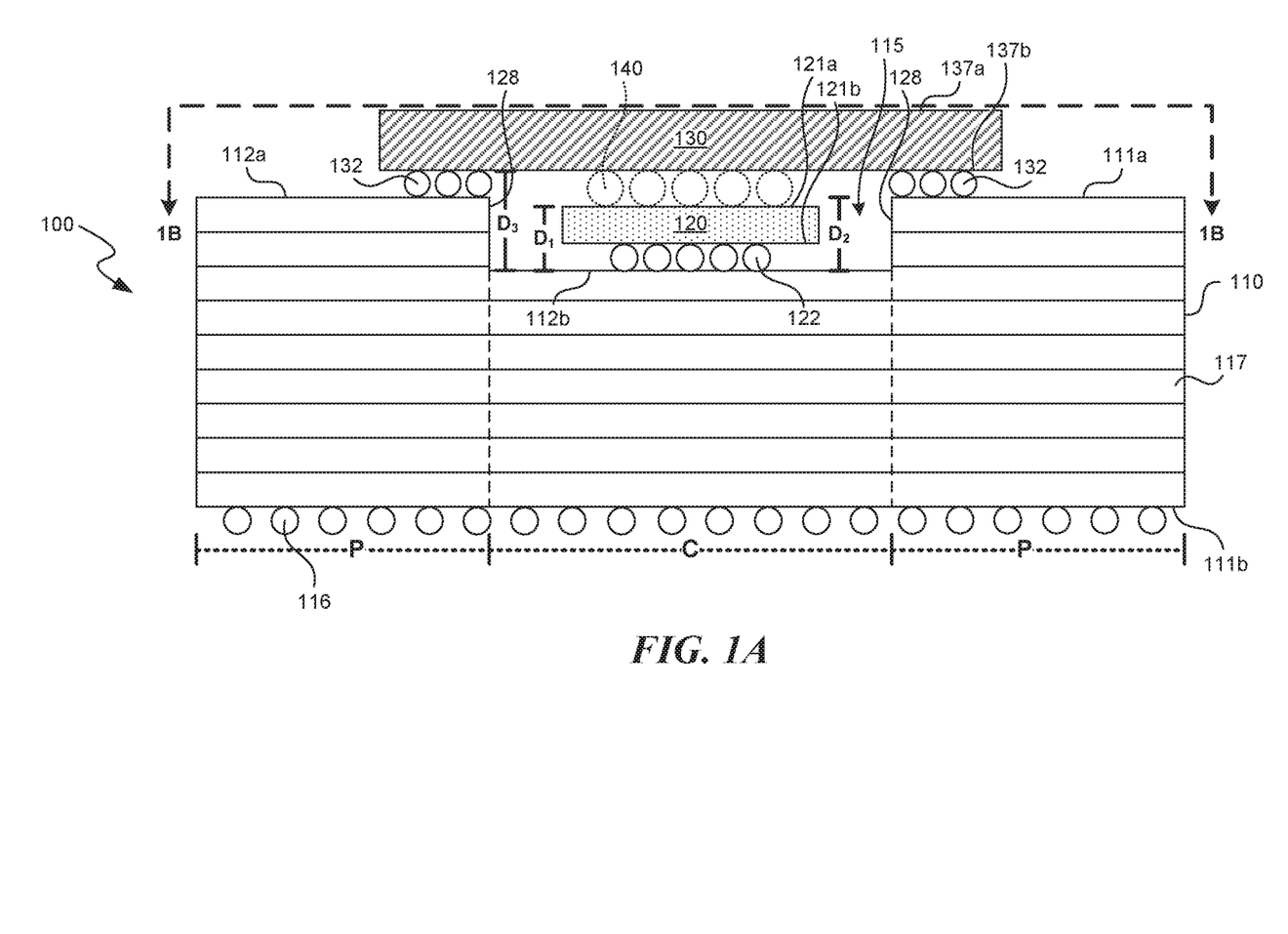
FIG. 1A is a schematic cross-sectional view of a semiconductor device assembly configured in accordance with an embodiment of the present technology.
Figure 1B:
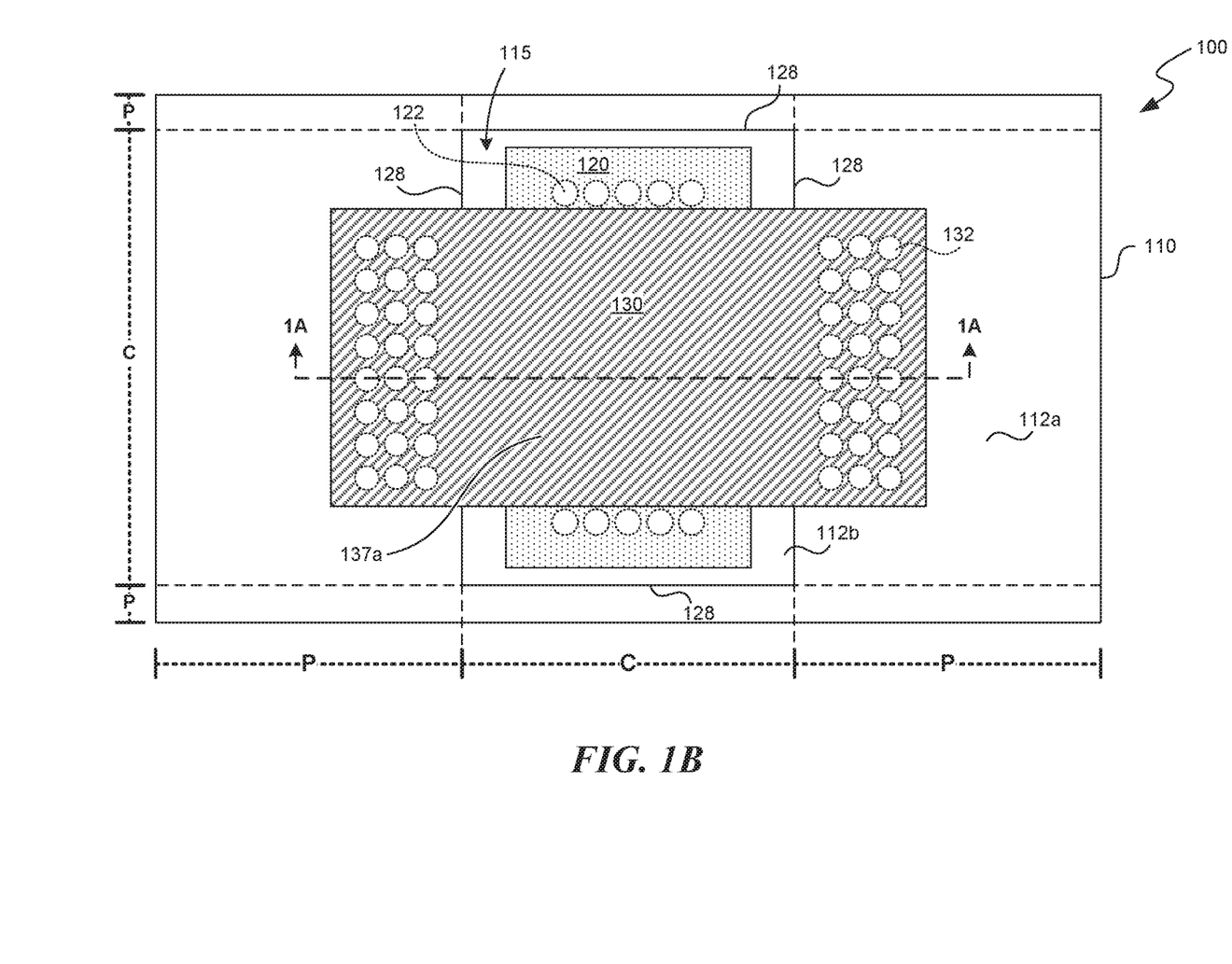
FIG. 1B is a schematic top view of the semiconductor device assembly shown in FIG. 1A taken along line 1B-1B.

FIG. 1A is a schematic cross-sectional view of a semiconductor device assembly 100 ("assembly 100") configured in accordance with an embodiment of the present technology, and FIG. 1B is a schematic top view of the assembly 100 shown in FIG. 1A taken along line 1B-1B. The assembly 100 shown in FIG. 1A is taken along line 1A-1A of FIG. 1B. Referring to FIGS. 1A and 1B together, the assembly 100 includes a base substrate 110, a first die 120 mounted to the substrate 110, and a second die 130 mounted to the substrate 110. The substrate 110 includes a first side 111a, a second side 111b opposite the first side 111a, a cavity 115 at the first side 111a, and one or more power and/or signal layers 117 having circuitry (e.g., copper traces and vias) for electrically coupling the first and second semiconductor dies 120, 130 to each other, other electrical devices, and/or electrical connectors 116 (e.g., solder balls, gold fingers, or other interconnections). The substrate 110, for example, can be a printed circuit board (PCB) or other type of substrate commonly used in semiconductor device packages. In some embodiments, the substrate 110 can be formed at least in part from silicon. The substrate 110 includes a cavity region (C) and a perimeter region (P) at least partially surrounding the cavity region (C). As such, the substrate 110 includes a continuous outermost surface including at least an upper surface 112a of the perimeter region (P), a lower surface 112b of the cavity region (C), and sidewalls 128. In the illustrated embodiment, the perimeter region (P) completely surrounds the cavity region (C).

The cavity 115 is positioned in the cavity region (C) of the substrate, and is defined by the sidewalls 128 and the lower surface 112b. The sidewalls 128 extend at least partially through the substrate 110 to an intermediate depth, or a second distance ($D_2$). In some embodiments, the sidewalls 128 can extend through the substrate 110 from the first side 111a to the second side 111b. In the illustrated embodiment of FIG. 1B, the cavity 115 is positioned entirely within the substrate 110 and thus includes four sidewalls 128. In other embodiments, the cavity 115 can extend to or beyond a length or width of the substrate 110 and therefore may only include two sidewalls 128 (e.g., FIG. 3). Although the cavity 115 illustrated in FIGS. 1A and 1B has a rectilinear plan with four sidewalls, in other embodiments a cavity can have any one of a number of other shapes, including regular polygons with any number of sides, irregular polygons, ellipses or curvilinear shapes, etc.

The first die 120 is positioned within the cavity 115 and includes a top surface 121a and a bottom surface 121b opposite the top surface 121a. The first die 120 is attached to the base substrate 110 via a plurality of electrical connectors 122 (e.g., solder balls, bond pads, etc.) at the bottom side 121b. The top surface 121a is separated from the lower surface 112b of the cavity 115 by a first distance ($D_1$). In the illustrated embodiment, the first distance ($D_1$) is less than the second distance ($D_2$) previously described. Accordingly, the first die 120 is positioned entirely within the cavity 115 such that the top surface 121a of the first die 120 is below the upper surface 112a of the perimeter region (P) of the substrate 110. In other embodiments, the first distance ($D_1$) can be equal to (e.g., FIGS. 2A-2C) or slightly greater than the second distance ($D_2$). The first die 120 can include a memory device or memory module (e.g., DRAM, LPDRAM, SRAM, DIMM, NVDIMM, RDIMM, LRDIMM, Flash, etc.). In some embodiments, the first die 120 can include a logic device and/or processor.

The illustrated embodiment of FIG. 1A includes only a single die. In some embodiments, additional dies may be included in the cavity 115. For example, a stack of dies in the cavity 115 can be configured as a hybrid memory cube (HMC) in which the lowermost die is a logic die that provides memory control (e.g., DRAM control), and the stacked dies over the lowermost die are DRAM or other memory dies that provide data storage. In such an embodiment, a top surface of the outermost die of the stack is below a bottom surface of the second die 130.

The second die 130 is positioned over a portion of the first die 120 and includes a top surface 137a and a bottom surface 137b. As such, the second die 130 traverses the first die 120 and the cavity region 115. The second die 130 is attached to the substrate 110 at the perimeter region (P) via electrical connectors 132 (e.g., solder balls, bond pads, etc.). The electrical connectors 132 can electrically couple the second die 130 to (i) the substrate 110 and/or (ii) the first die 120 via the substrate 110. In the illustrated embodiment, the second die 130 includes a larger lateral dimension than that of the cavity 115 and the first die 120. The bottom surface 137b of the second die 130 is spaced apart from the lower surface 112b of the cavity region (C) by a third distance ($D_3$). The third distance ($D_3$) is larger than each of the first distance ($D_1$) and the second distance ($D_2$). The second die 130 can be a logic device, processor, or another memory device. Optionally, the assembly 100 can also include electrical connectors 140 (e.g., solder balls, bond pads, etc.) between the first and second dies 120, 130. In such an embodiment, the electrical connectors 140 electrically couple the first die 120 directly to the second die 130.

One benefit of the present technology is the decreased thickness of the assembly 100 achieved by mounting the first die 120 within the cavity 115 and/or below the second die 130. Because the first die 120 is mounted within the cavity 115, the second die 130 can be mounted over the first die 120 and proximate the upper surface 112b 112a of the substrate, thereby decreasing the thickness of the overall assembly. As mentioned previously, stacked devices have higher probabilities of device failure and higher costs associated with longer manufacturing and testing times. Accordingly, assemblies including the present technology can result in higher yields, more efficient manufacturing, and decreased costs.

Another benefit of the present technology is the ability to more efficiently dissipate heat from the first die 120 and/or the second die 130. Unlike conventional stacked devices wherein multiple dies are stacked directly over one another, the present technology includes air gaps between the first and second dies 120, 130 thereby allowing both dies to cool via convection to the surrounding environment. Accordingly, the assembly 100 can maintain a lower average operating temperature compared to a stacked device, resulting in more efficient operation and longer run times.

Yet another benefit of the present technology is the positioning of the second die 130 relative to the first die 120. In conventional stacked assemblies, the processor is often the main heat-generating source and is usually positioned proximate the substrate at the bottom of the stack. This is in part because the processor usually includes the largest lateral dimension relative to the other dies of the stack. This type of arrangement causes heat to become trapped at the bottom of the stack, and results in an overall increased operating temperature for the assembly. Unlike conventional stacked assemblies, the second die 130 of the present technology can include a processor and be positioned over the first die 120. As such, any heat generated from the processor is released upwards toward the surrounding environment and has less thermal effect on the first die 120 within the cavity 115. Therefore, the present technology can result in a lower operating temperature and more efficient device.

Figure 2A:
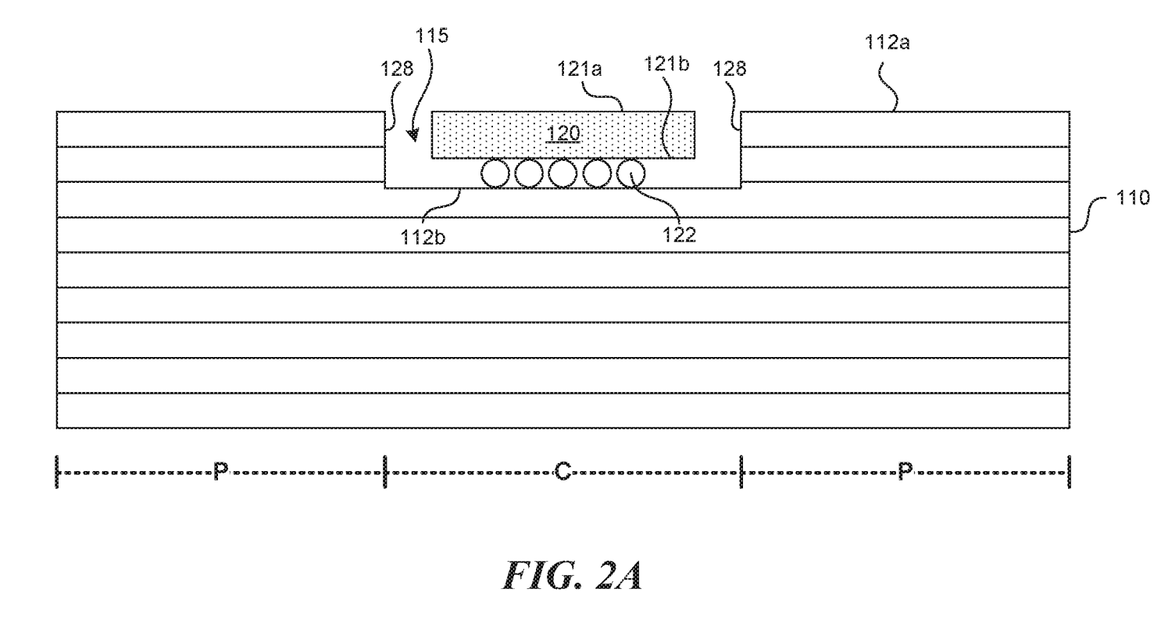
FIGS. 2A-2C are schematic cross-sectional views illustrating a method of forming a semiconductor device assembly in accordance with an embodiment of the present technology.
Figure 2B:
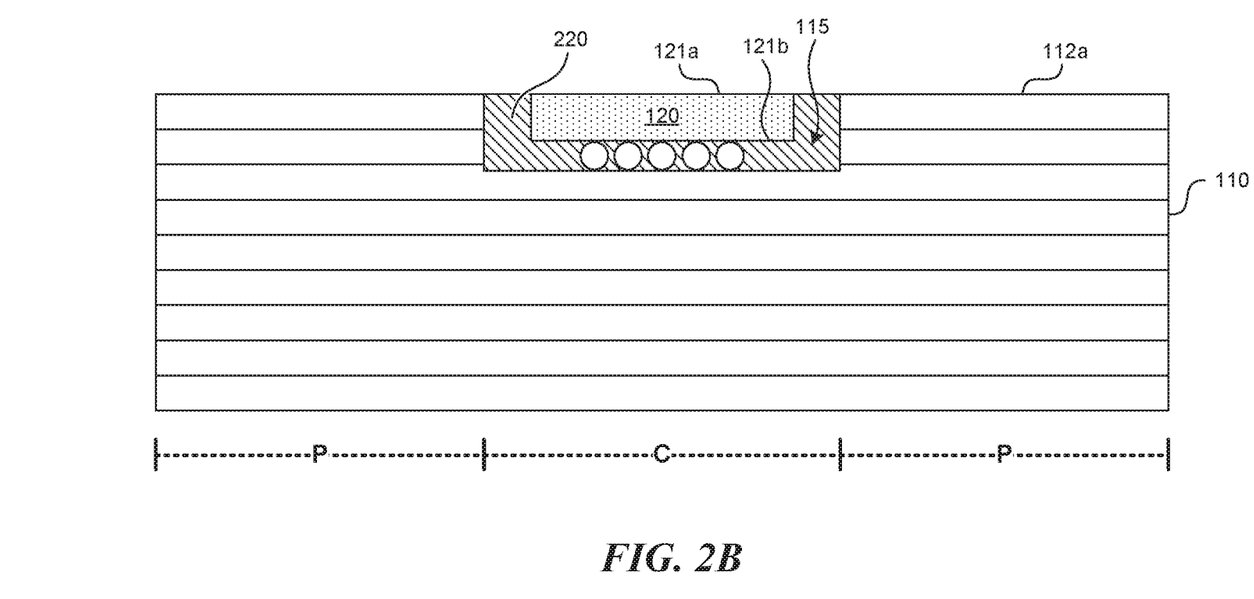
Figure 2C:
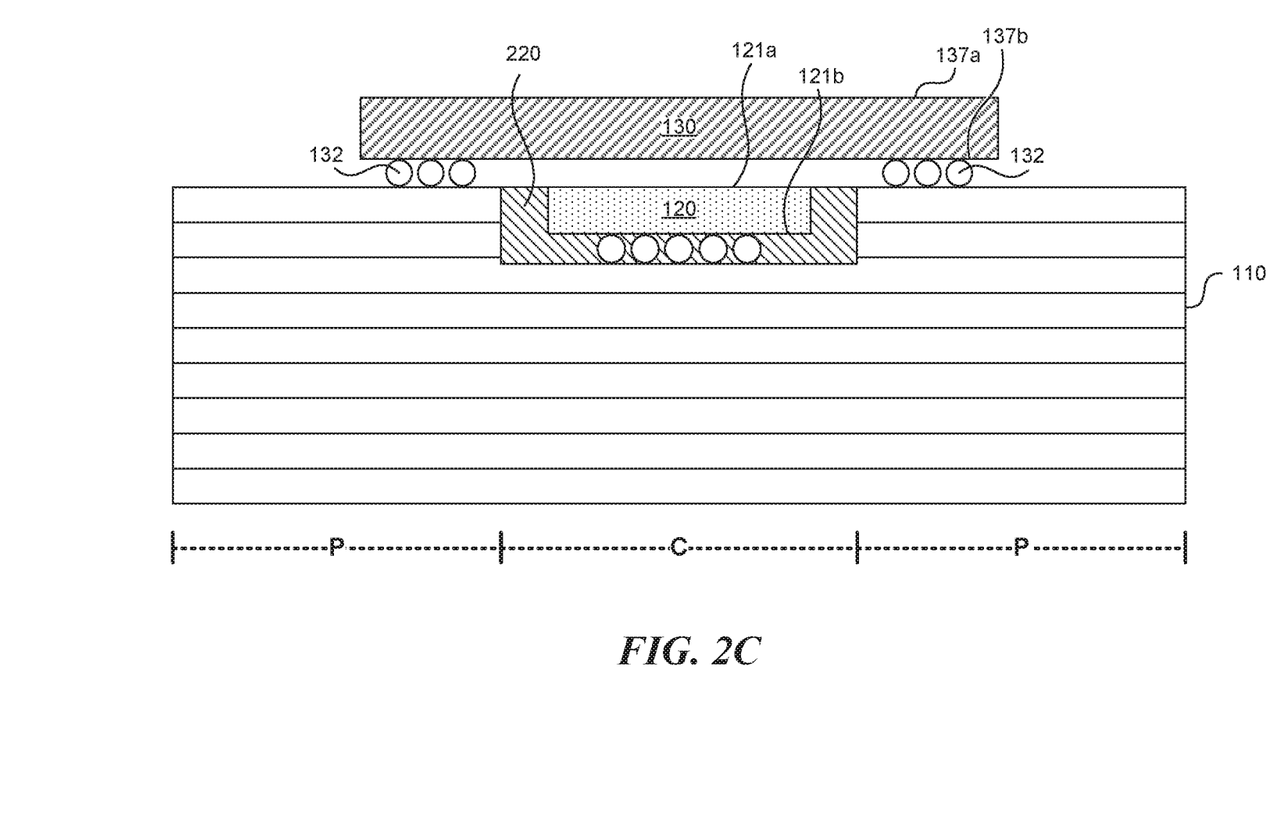

FIGS. 2A-2C are schematic cross-sectional views illustrating a method of forming a semiconductor device assembly (such as or similar to the assembly 100) in accordance with an embodiment of the present technology. FIG. 2A illustrates the method after the cavity 115 has been formed in the substrate 110 and the first die 120 has been disposed within the cavity 115 between the sidewalls 128. The cavity 115 can be formed by grinding, dry etching, chemical etching, chemical polishing, chemical-mechanical polishing, or other suitable processes known in the art. The lateral dimension or width of the cavity may be predetermined to ensure the first die 120 can fit within cavity 115. Similarly, the depth of the cavity 115 may be predetermined based on the combined height of the first die 120 and the electrical connectors 122 before and/or after reflow. In the illustrated embodiment, the top surface 121a of the first die 120 is generally co-planar with the upper surface 112a of the perimeter region (P) of the substrate 110.

FIG. 2B illustrates an embodiment of the method after a mold material 220 (e.g., an underfill material, encapsulant, etc.) has been deposited in the cavity 115 to encapsulate the first die 120. In the illustrated embodiment, an outer surface of the mold material 220 is flush with the upper surface 112a of the perimeter region (P) of the substrate 110. Thus, in the illustrated embodiment, the mold material 220 only partially encapsulates the first die 120 because the top surface 121a of the first die 120 is generally co-planar with the upper surface 112a of the perimeter region (P) and is thus exposed through the mold material 220. In other embodiments, the top surface 121a of the first die 120 is below the upper surface 112a (e.g., FIGS. 1A and 1B). In such an embodiment, the top surface 121a is not exposed through the mold material 220, and thus the mold material 220 completely encapsulates the first die 120. In other embodiments, the mold material 220 can be omitted.

FIG. 2C illustrates an embodiment of the method after the second die 130 is disposed over at least a portion of the first die 120 and/or the cavity 115 and mounted to the substrate 110 at the perimeter region (P). The second die 130 can be electrically coupled to the first die via circuitry of the substrate 110. As previously described with reference to FIG. 1A, in some embodiments, the method can further include depositing electrical connectors (not shown) between the first and second dies 120, 130 prior to disposing the second die 130 on the substrate 110. In such an embodiment, the electrical connectors couple the first die 120 directly to the second die 130. As described in further detail below with reference to FIGS. 3 and 4, the method can further include disposing a third die on the substrate 110 that is stacked on or spaced apart from the second die 130.

Figure 3:
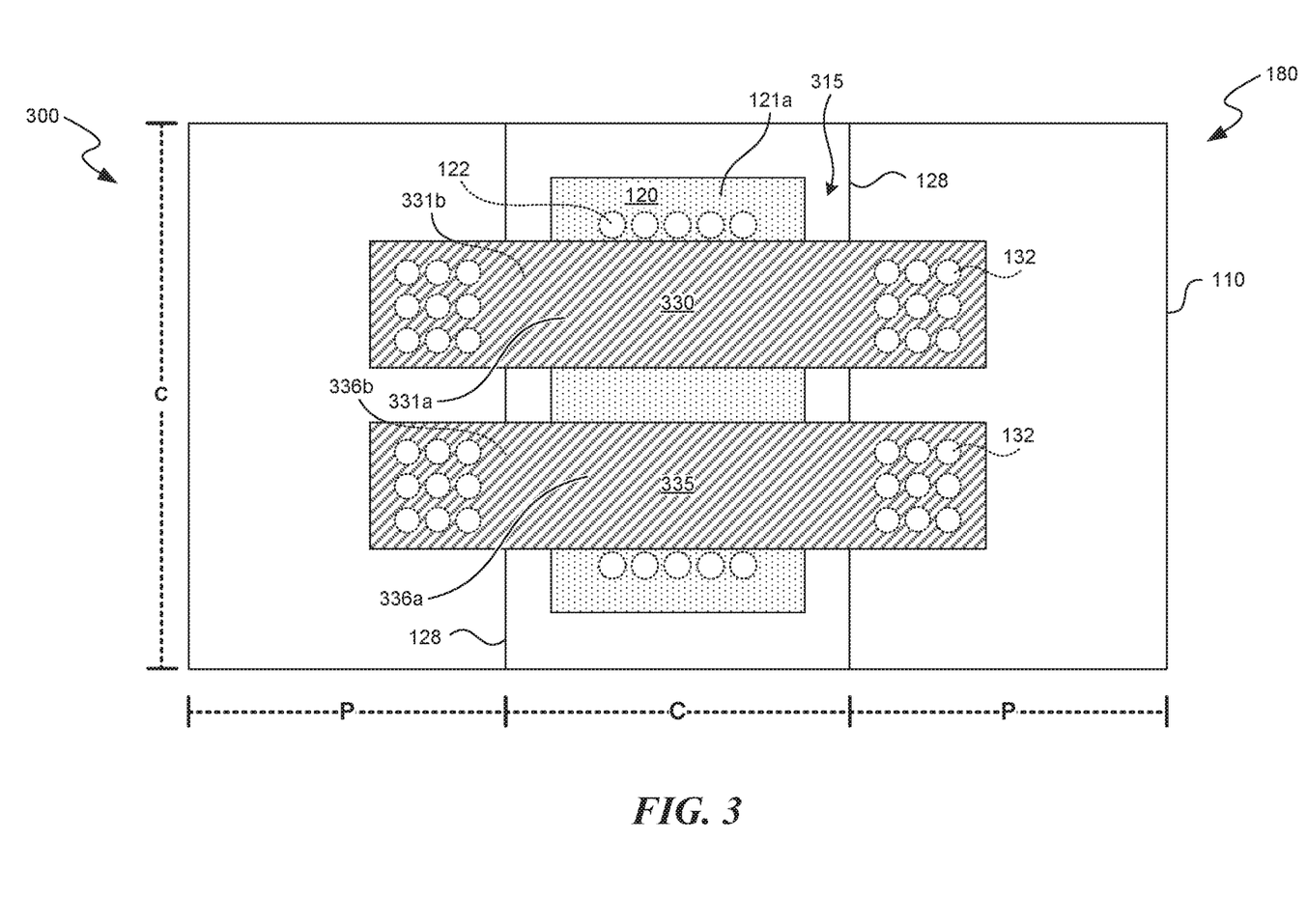
FIG. 3 is a schematic top view of a semiconductor device assembly configured in accordance with another embodiment of the present technology.

FIG. 3 is a schematic top view of a semiconductor device assembly ("assembly 300") configured in accordance with another embodiment of the present technology. The assembly 300 is generally similar to the assembly 100 previously described. For example, the assembly 300 includes the substrate 110 having a cavity 315 with the first die 120 positioned therein. The assembly 300 includes a cavity region (C) and a perimeter region (P) that only partially surrounds the cavity region (C). The assembly 300 further includes a second die 330 and a third die 335 each attached to the substrate 110 at the perimeter region (P). The second die 330 includes a top surface 331a and a bottom surface 331b opposite the top surface 331a. The bottom surface 331b is attached to the substrate 110 via electrical connectors 132. The third die 335 includes a top surface 336a and a bottom surface 336b opposite the top surface 336a. The bottom surface 336b is attached to the substrate 110 via electrical connectors 132. The second and third dies 330, 335 each traverse a different portion of the first die 120.

Figure 4:
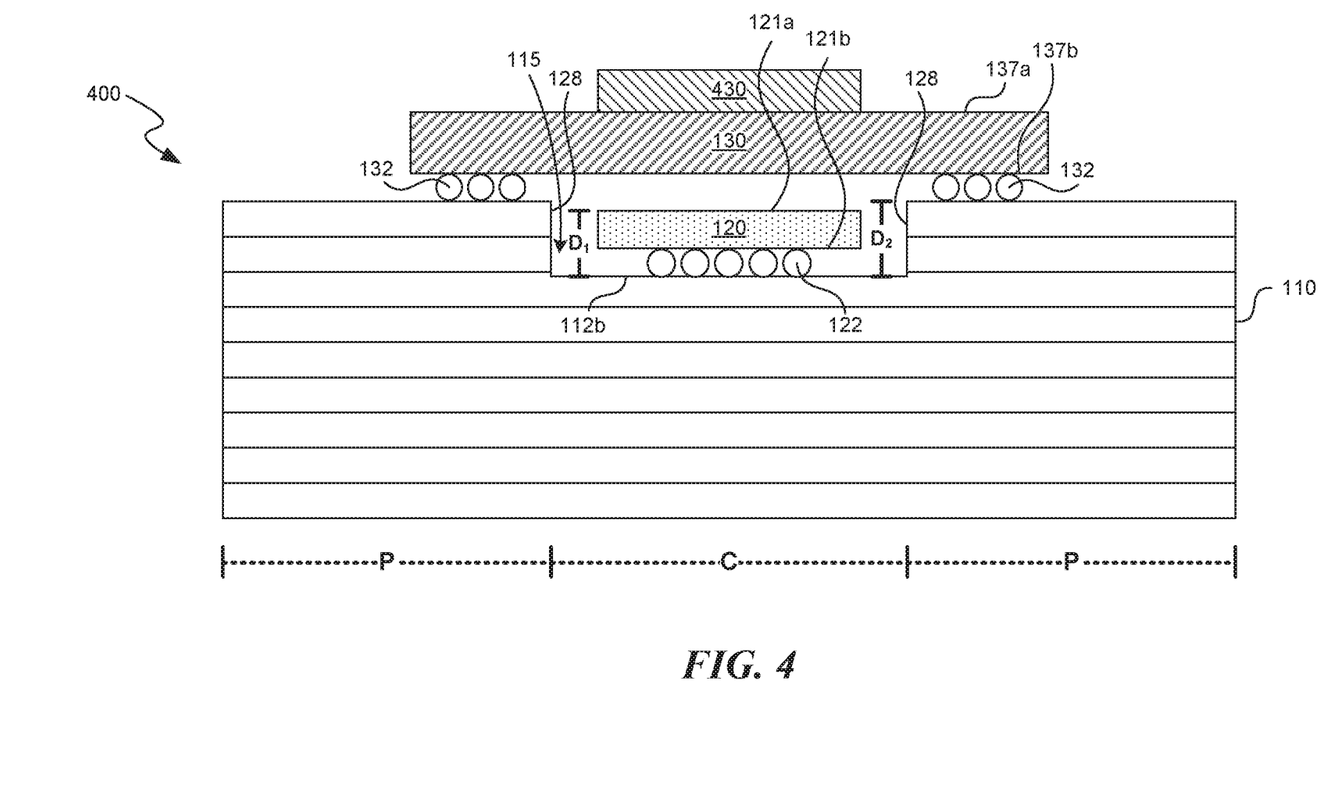
FIGS. 4-7 are schematic cross-sectional views of semiconductor device assemblies configured in accordance with other embodiments of the present technology.

FIG. 4 is a schematic cross-sectional view of a semiconductor device assembly 400 ("assembly 400") configured in accordance with another embodiment of the present technology. The assembly 400 is generally similar to the assembly 100 previously described. For example, the assembly 400 includes the substrate 110 having the cavity 115, the first die 120 positioned in the cavity 115, and the second die 130 over the first die 120 and attached to the substrate 110 at the perimeter region (P). The assembly 400 includes a third die 430 stacked on and attached to the second die 130. The third die 430 can be electrically coupled to the second die 130 via a plurality of electrical connectors (e.g., solder balls, wirebonds, etc.). In other embodiments, the third die 430 can be attached and electrically coupled to the second die 130 via other means including interconnects, die attach films, TSVs, and/or other known methods in the art. A person of ordinary skill in the art will understand that additional dies can be stacked over the third die 430 and/or on the substrate 110.

Figure 5:
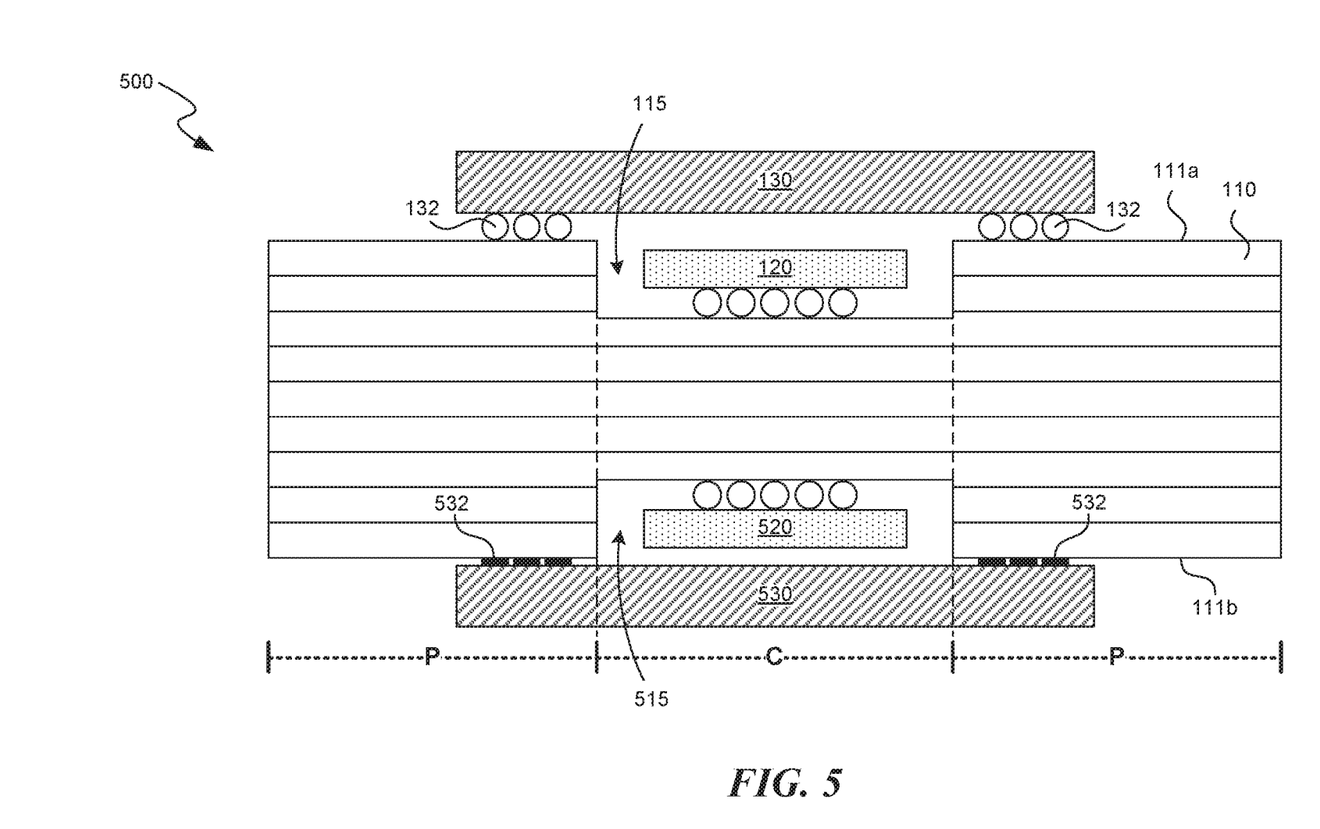

FIG. 5 is a schematic cross-sectional view of a semiconductor device assembly 500 ("assembly 500") configured in accordance with another embodiment of the present technology. The assembly 500 is generally similar to the assembly 100 previously described. For example, the assembly 500 includes the substrate 110 having the cavity 115, the first die 120 positioned in the cavity 115, and the second die 130 over the first die 120 and attached to the substrate 110 at the perimeter region (P). The assembly 500 includes a second cavity 515 at the second side 111b of the substrate 110, a third die 520 positioned in the cavity 515 and attached to the substrate 110, and a fourth die 530 traversing the third die 520 and attached to the substrate 110 at the perimeter region (P) via bond pads 532. The bond pads 532 can further decrease the thickness of the assembly 500 compared to a die attached to the substrate with solder balls or the like. The third die 520 and/or the fourth die 530 can be electrically coupled to the first die 120 and/or the second die 130 via circuitry of the substrate 110. The arrangement of the second cavity 515, third die 520, and fourth die 530 at the second side 111b can be similar or identical to the arrangement of the first cavity 115, first die 120, and second die 130 at the first side 111a. As such, the features and benefits previously described with reference to assembly 100 and FIGS. 1A-1B, also apply to the assembly 500. In some embodiments, the fourth die 530 can be omitted from the assembly 500. In such an embodiment, the assembly 500 may include electrical connectors (e.g., electrical connectors 116 from FIG. 1A) over the perimeter region (P) at the second side 111b of the substrate 110. The assembly 500 may also include electrical connections, such as edge fingers, interconnection sockets, and other similar structures commonly found on PCBs.

Figure 6:
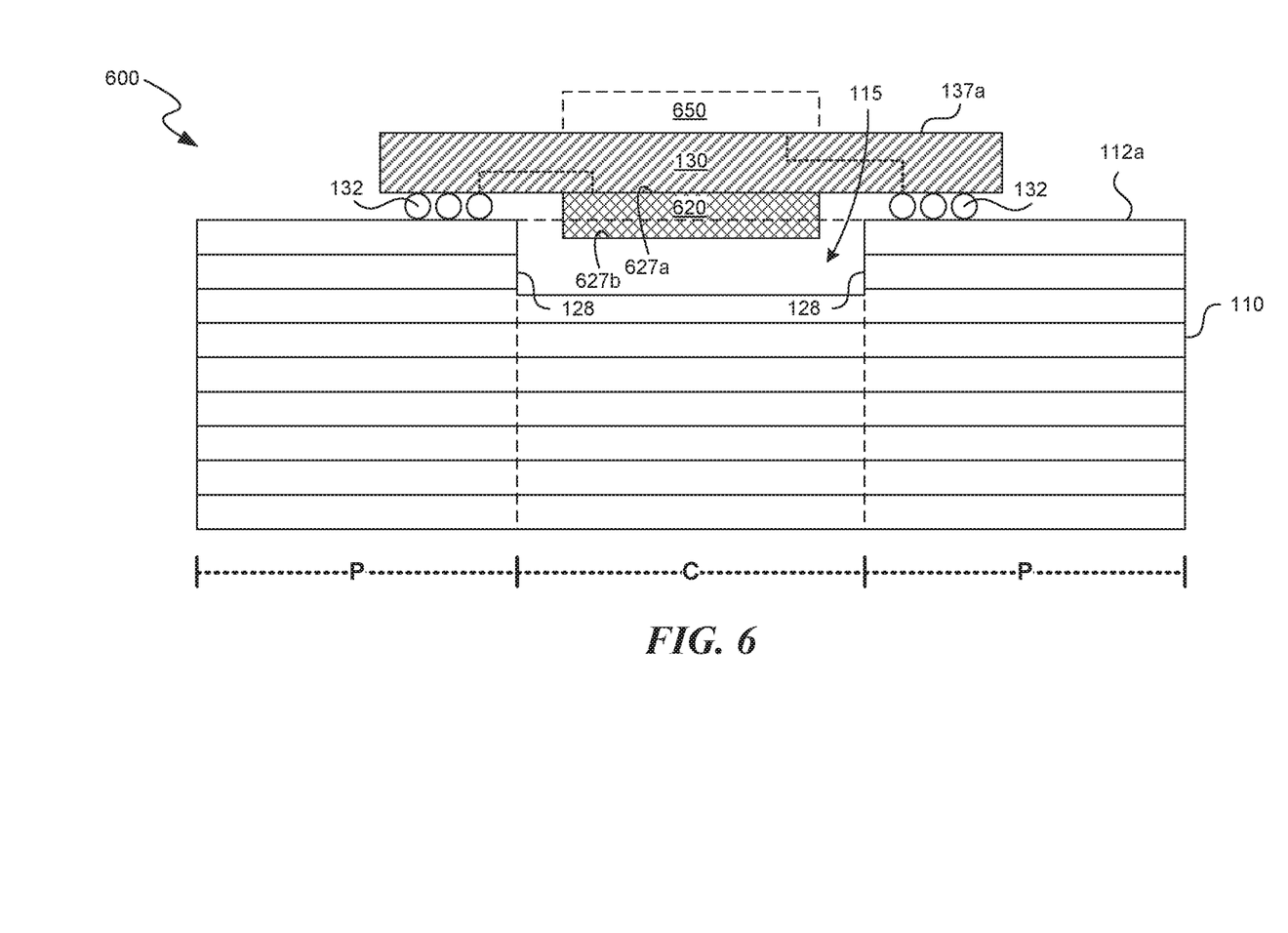

FIG. 6 is a schematic cross-sectional view of a semiconductor device assembly 600 ("assembly 600") configured in accordance with another embodiment of the present technology. The assembly 600 includes features generally similar to the assembly 100 previously described. For example, the assembly 600 includes the substrate 110 having the cavity 115, and the second die 130 attached to the substrate 110 at the perimeter region (P). The assembly 600 includes a first die 620 including a first surface 627a facing the second die 130, and a second surface 627b opposite the first surface 627a and facing the substrate 110. The first die 620 can be attached to the second die 130 via an adhesive tape, die attach film, bond pads, or other methods known in the art. The first die 620 is at least partially within the cavity 115 such that a portion of the first die 620 is between the sidewalls 128 and/or below the upper surface 112a. In the illustrated embodiment, for example, the second surface 627b is lower than the upper surface 112a. The first die 620 can be electrically coupled to the second die 130, and to the substrate 110 via the second die 130 and electrical connectors 132. The first die 620 can include features similar or identical to the first die 120 previously described. The assembly 600 can optionally include a third die 650 attached to the second die 130 at the top side 137a. The third die 650 can include features similar or identical to the first or second dies 120, 130 previously described. The assembly 600 can be formed via a similar method as described with reference to FIGS. 2A and 2C, except that the first die 620 is attached to the second die 130 before the second die is attached to the substrate 110. The third die 650 can be attached to the second die 130 before or after the first die 620 is attached to the second die 130.

Figure 7:
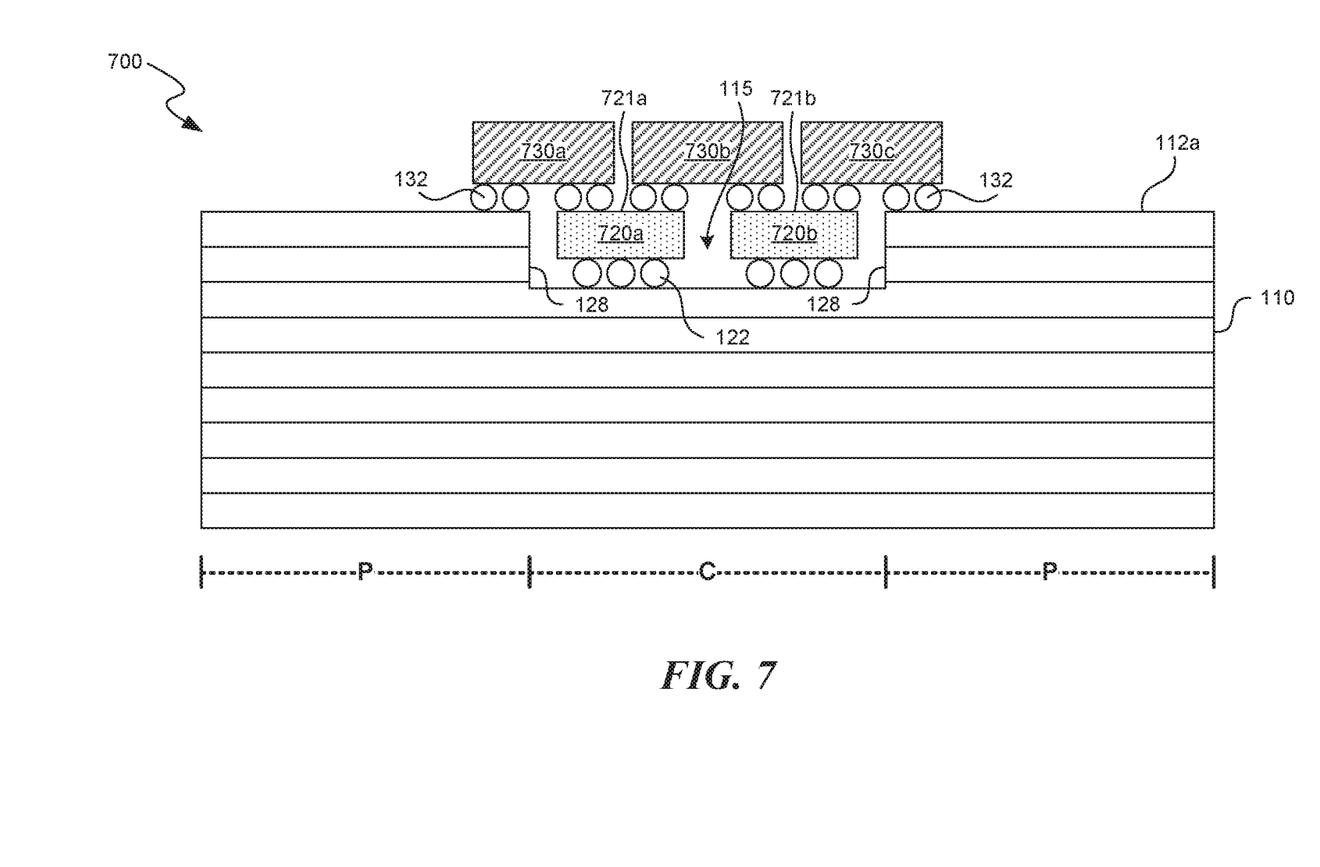

FIG. 7 is a schematic cross-sectional view of a semiconductor device assembly 700 ("assembly 700") configured in accordance with another embodiment of the present technology. The assembly 700 includes a first die 720a and a second die 720b that are between the sidewalls 128 and attached to the substrate 110 at the cavity 115 via electrical connectors 122. The first and second dies 720a-b can each include features generally similar to those of the first die 120 previously described. The assembly 700 further includes a third die 730a, a fourth die 730b, and a fifth die 730c over at least a portion of either the first and/or second dies 720a-b. The third, fourth, and fifth dies 730a-c can each include features general similar to those of the second die 130 previously described. The third die 730a and the fifth die 730c are each attached to the base substrate via electrical connectors 132 with a first portion of the electrical connectors 132 attached directly to the perimeter region (P) at the upper surface 112a of the substrate 110, and a second portion of the electrical connectors 132 attached directly to a top surface 721a of the first die 720a. As such, the third die 730a and the fifth die 730c extend over only a portion of (a) the cavity 115 and (b) the first die 720a or second die 720b respectively. The fourth die 730b is attached directly to the first and second dies 720a-b via electrical connectors 132, with a first portion of the electrical connectors 132 attached to the top surface 721a of the first die 720a and a second portion of the electrical connectors 132 attached to the top surface 721b of the second die 720b. As such, the fourth die 730b is positioned over the cavity 115 and between the sidewalls 128. In some embodiments, the third, fourth and/or fifth dies 730a-c may be omitted. For example, the assembly 700 can include only the fourth die 730b or only the third and fifth dies 730a,c.

Figure 8:
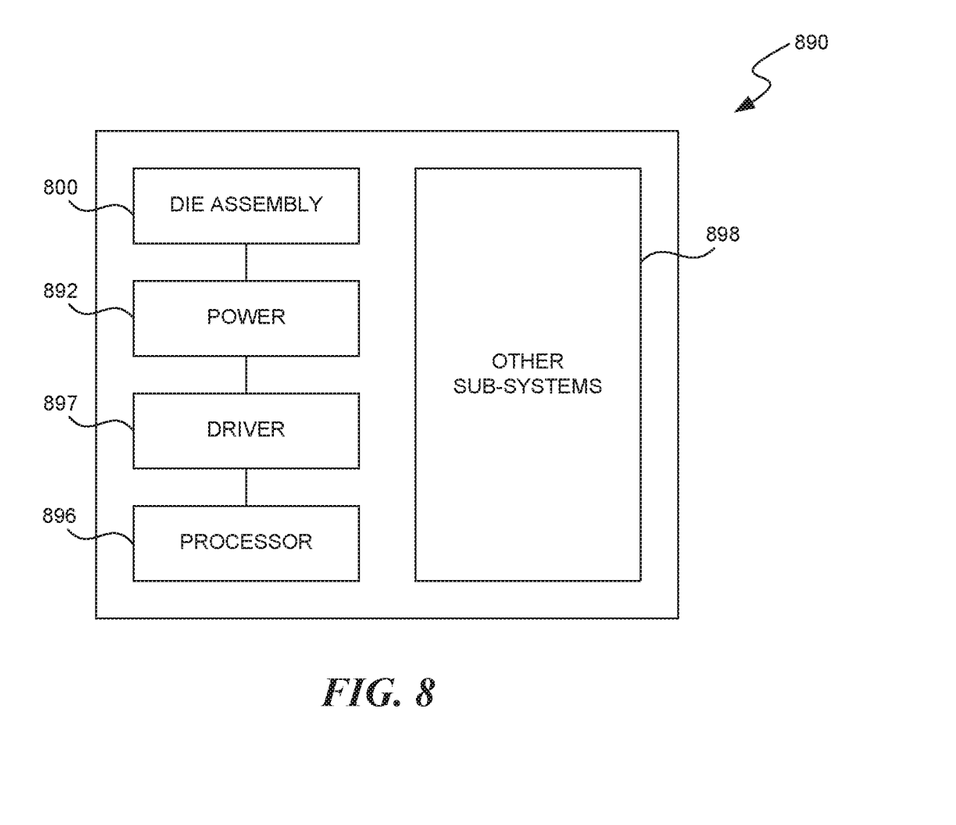
FIG. 8 is a schematic view of a system that includes a semiconductor die assembly configured in accordance with embodiments of the present technology.

Any one of the semiconductor devices and/or assemblies described above with reference to FIGS. 1A-7 can be incorporated into any of a myriad of larger and/or more complex systems, a representative example of which is system 890 shown schematically in FIG. 8. The system 890 can include a semiconductor assembly 800 ("assembly 800"), a power source 892, a driver 897, a processor 896, and/or other subsystems or components 898. The assembly 800 can include features generally similar to those assemblies described above. The resulting system 890 can perform any of a wide variety of functions, such as memory storage, data processing, and/or other suitable functions. Accordingly, representative systems 890 can include, without limitation, hand-held devices (e.g., mobile phones, tablets, digital readers, and digital audio players), computers, and appliances. Components of the system 890 may be housed in a single unit or distributed over multiple, interconnected units (e.g., through a communications network). The components of the system 890 can also include remote devices and any of a wide variety of computer readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. For example, the illustrated embodiments of FIG. 4, which includes stacked devices, and FIG. 5, which includes multiple cavities and dies positioned therein, can be combined or incorporated into other embodiments, such as the illustrated embodiment of FIG. 6. In some cases, well-known structures and functions have not been shown or described in detail to avoid unnecessarily obscuring the description of the embodiments of the present technology. For example, a person of ordinary skill in the art will understand that the dies previously described can include a plurality of passive components, such as resistors, capacitors, and/or other types of electrical devices incorporated therein. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein, and the invention is not limited except as by the appended claims.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising," "including," and "having" are used throughout to mean including at least the recited feature(s) such that any greater number of the same feature and/or additional types of other features are not precluded. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

I claim:
1. A semiconductor device assembly comprising:
a base substrate having a cavity and a perimeter region at least partially surrounding the cavity, wherein the cavity extends at least partially through the base substrate and has an opening width measured across opposing edges of the perimeter region;
a first die in the cavity and attached to the base substrate at the cavity, wherein the first die has a first length measured along a first lateral direction orthogonal to the opening width; and
a second die over at least a portion of the first die, extending across the opposing edges of the perimeter region, and attached to the base substrate at the perimeter region, wherein the second die has (1) a die width that is greater than the opening width of the cavity and (2) a second die length that is measured along a second lateral direction parallel to the first lateral direction and that is less than the first length;
wherein a top surface of the first die and a bottom surface of the second die are separated by a distance corresponding to an air channel for cooling the first and second dies via convection; and
the top surface of the first die is exposed to ambient environment;
wherein the first die includes a memory chip and the second die includes a processor chip;
wherein the base substrate includes a first side and a second side opposite the first side, wherein the perimeter region is a first perimeter region and the cavity is a first cavity, and wherein the first cavity and the first perimeter region are at the first side of the base substrate, the assembly further comprising:
a second cavity at the second side of the substrate and extending at least partially through the substrate toward the first side of the substrate;
a second perimeter region at least partially surrounding the second cavity;
a third die in the second cavity and attached to the base substrate at the second cavity; and
a fourth die over the third die and attached to the base substrate at the second perimeter region.

2. The assembly of claim 1, wherein the base substrate includes a continuous outermost surface spanning along a lower surface of the cavity and an upper surface of the perimeter region.

3. The assembly of claim 1 wherein the perimeter region includes an upper surface and the cavity includes a lower surface separated from the upper surface by a first distance, and wherein the first die includes the top surface separated from the lower surface of the cavity by a second distance less than the first distance.

4. The assembly of claim 1 wherein the first die and the second die are attached to the base substrate with a plurality of solder balls.

5. The assembly of claim 1 wherein the first die and the second die are attached to the base substrate with a plurality of bond pads.

6. The assembly of claim 1, further comprising a plurality of solder balls between and attached to the first die and the second die.

7. The assembly of claim 6 wherein the plurality of solder balls contact the top surface of the first die and the bottom surface of the second die.

8. The assembly of claim 1 wherein the perimeter region completely surrounds the cavity.

9. The assembly of claim 1, further comprising an encapsulant at least partially encapsulating the first die, wherein a top surface of the encapsulant is below the bottom surface of the second die.

10. The assembly of claim 1, further comprising a third die attached to the second die, wherein the third die is over the first die and the second die.

11. The assembly of claim 1 wherein the portion of the first die is a first portion, the assembly further comprising a third die attached to the base substrate at the perimeter region and spaced apart from the second die, wherein the third die is over at least a second portion of the first die.

12. The assembly of claim 1 wherein one or more peripheral portions of the top surface of the memory chip laterally extends past corresponding peripheral edges of the processor chip.

13. The assembly of claim 12 wherein:
the processor chip and the memory chip comprise a die stack;
the processor chip is located at a top portion of the die stack for releasing heat generated by the processor chip upward; and
the one or more peripheral portions of the top surface of the memory chip is uncovered by the processor chip for reducing thermal effect between the processor chip and the memory chip.

14. A stacked package system comprising:
a substrate having a cavity region and a perimeter region at least partially peripheral to the cavity region, wherein the cavity region is defined by sidewalls extending at least partially through the substrate and separated by an opening width measured across opposing portions of the side walls;
a first die attached to the substrate and positioned between the sidewalls of the cavity region, wherein the first die has a first length measured along a first lateral direction orthogonal to the opening width; and
a second die over the first die, extending across the opening width and over the opposing portions of the perimeter region, and attached to the base substrate at the perimeter region, wherein the second die has (1) a die width that is greater than the opening width of the cavity and (2) a second die length that is measured along a second lateral direction parallel to the first lateral direction and that is less than the first length;
wherein a top surface of the first die and a bottom surface of the second die are separated by a distance corresponding to an air channel for cooling the first and second dies via convection; and
the top surface of the first die is exposed to ambient environment;
wherein the first die includes a memory chip and the second die includes a process; and
wherein the base substrate includes a first side and a second side opposite the first side, wherein the perimeter region is a first perimeter region and the cavity is a first cavity, and wherein the first cavity and the first perimeter region are at the first side of the base substrate, the assembly further comprising:
a second cavity at the second side of the substrate and extending at least partially through the substrate toward the first side of the substrate;
a second perimeter region at least partially surrounding the second cavity;
a third die in the second cavity and attached to the base substrate at the second cavity; and
a fourth die over the third die and attached to the base substrate at the second perimeter region.

15. The system of claim 14 wherein the cavity region includes a lower surface between the sidewalls, and wherein the first die is attached to the lower surface via a plurality of connectors.

16. The system of claim 15 wherein the plurality of connectors includes bond pads.

17. The system of claim 14 wherein the second die includes a bottom side facing at least partially toward the substrate and a top side opposite the bottom side, and wherein the first die is attached to the second die at the bottom side.

18. The system of claim 17, further comprising a third die attached to the substrate, wherein the third die is stacked on the top side of the second die.

19. The system of claim 14 wherein at least a portion of the first die extends into the cavity region of the substrate.

20. The system of claim 14, further comprising a third die spaced apart from the first die and attached to the substrate at the cavity region.

21. The system of claim 14 wherein the second die attached to the base substrate at the perimeter region is a first portion, and wherein the second die includes a second portion attached to the first die between the sidewalls of the cavity region.

* * * * *